United States Patent
Yabuta et al.

(10) Patent No.: US 6,403,757 B1
(45) Date of Patent: Jun. 11, 2002

(54) MODIFIED POLYAMIDE RESIN AND HEAT-RESISTANT COMPOSITION CONTAINING THE SAME

(75) Inventors: Katsunori Yabuta; Kiyokazu Akahori; Yasushi Nishikawa, all of Otsu (JP)

(73) Assignee: Kanegafuchi Kagaku Kogyo Kabushiki Kaisah, Osaka (JP)

( * ) Notice: Subject to any disclaimer, the term of this patent is extended or adjusted under 35 U.S.C. 154(b) by 0 days.

(21) Appl. No.: 09/462,382

(22) PCT Filed: Apr. 22, 1999

(86) PCT No.: PCT/JP99/02167
§ 371 (c)(1),
(2), (4) Date: Jan. 7, 2000

(87) PCT Pub. No.: WO99/57170
PCT Pub. Date: Nov. 11, 1999

(30) Foreign Application Priority Data

May 7, 1998 (JP) ............................................. 10-124551
May 7, 1998 (JP) ............................................. 10-124620

(51) Int. Cl.$^7$ ........................ C08G 69/48; C08G 69/46; C08G 59/14; C08G 59/40; C08L 77/00
(52) U.S. Cl. ........................ 528/310; 528/322; 528/403; 528/425; 528/480; 528/486; 428/343; 525/418; 525/419; 525/420; 525/422; 525/423; 525/430
(58) Field of Search ............................... 428/343; 528/310, 528/322, 403, 480, 486, 425; 525/418, 419, 420, 422, 423, 430

(56) References Cited

U.S. PATENT DOCUMENTS 5,371,175 A * 12/1994 Nojiri et al. ................. 528/335
5,726,281 A * 3/1998 Nojiri et al. ................. 528/335

FOREIGN PATENT DOCUMENTS

| JP | 5-51447 | 3/1993 |
| JP | 5-51571 | 3/1993 |
| JP | 5-230430 | 9/1993 |
| JP | 5-295081 | 11/1993 |

* cited by examiner

*Primary Examiner*—P. Hampton-Hightower
(74) *Attorney, Agent, or Firm*—Fitch, Even, Tabin & Flannery

(57) ABSTRACT

A reaction between epoxy-terminated polyamide and an acid anhydride compound can yield a modified polyamide resin, into resin skeleton of which carboxy groups to react with epoxy resin are introduced. An adhesive agent having excellent heat-resistance can be provided by the use of a composition of this modified polyamide resin and epoxy resin. Furthermore, an adhesive tape for a semiconductor device having excellent properties can be produced by laminating the adhesive agent and the protective layer on one surface of an organic insulated film.

5 Claims, No Drawings

MODIFIED POLYAMIDE RESIN AND HEAT-RESISTANT COMPOSITION CONTAINING THE SAME

FIELD OF THE INVENTION

The present invention relates to a modified polyamide resin, a heat-resistant resinous composition containing the same, and an adhesive tape for a semiconductor device comprising the heat-resistant resinous composition. Particularly, the present invention relates to a modified polyamide resin, which is suitably used as polyamide component of epoxy/polyamide adhesive agent having excellent adhesiveness and being used for mounting electric and electronic parts of a flexible printed wiring board, an adhesive member of a semiconductor device, and the like, an heat-resistant resinous composition containing the same, and a three-layered adhesive tape for a semiconductor device, which comprises the heat-resistant resinous composition as an adhesive layer and can be used for mounting ball grid arrays (BARS) mounted in the tape automated bonding (TAB) method.

BACKGROUND OF THE INVENTION

It is well-known that epoxy/nylon adhesive agent has been used for mounting such electric or electronic parts of a flexible wiring board and an adhesive member of a semiconductor device as adhesive agent having excellent adhesiveness and high heat resistance. Since polyamide resin such as nylon is of inferior hygroscopicity and heat-resistance, it is not preferable to increase the proportion of nylon in epoxy/nylon resin. On the other hand, since polyamide resin is not good compatibility with many kinds of epoxy resin, epoxy/nylon adhesive agent comprising higher amount of epoxy resin may not often be of uniform thickness when it is dried, which results in unreliability of adhesiveness and instability of the quality.

The published Japanese Patent Applications No. 5-51447 and No. 5-51571 disclose an epoxy modified polyamide resin having an improved compatibility with epoxy resin.

However, adhesive agents for electronic parts have been recently desired to have more excellent properties, particularly to have more excellent heat-resistance, but epoxy/polyamide adhesive agent containing the above epoxy modified polyamide resin cannot satisfy such a high heat-resistance as to be desired. In order to increase heat-resistance, an adhesive agent containing polyamide resin/resol phenol resin has been developed. However, such adhesive agent exhibit a considerably high curing shrinkage due to dehydro-condensation reaction of resol-type phenol resin, and its warping level is increased when it is used for a flexible printed wiring board and an adhesive member for a semiconductor device such as TAB(Tape Automated Bonding) tape. As the result, misalignment caused by differences in size and conveyance failure occurs in the process of conveyance.

An object of the present invention is to provide a heat-resistant resinous composition having a high heat-resistance, a high adhesive property, and the ability of low curing shrinkage, which are required of adhesive agent for electronic parts.

Another object of the present invention is to provide an adhesive tape for a semiconductor device having an excellent heat-resistance and small warping level, which does not generate any defectives during a process.

DISCLOSURE OF THE INVENTION

A modified polyamide resin of the present invention can be obtainable by a reaction of an acid anhydride compound and epoxy-terminated polyamide having the following structure

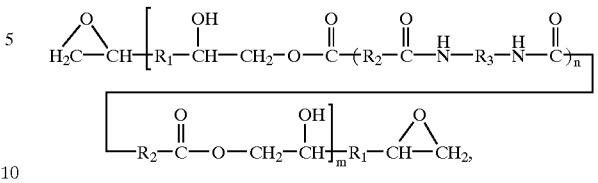

wherein $R_1$, $R_2$, and $R_3$ each are a bivalent organic group, and m and n each are a natural number.

A heat-resistant resinous composition of the present invention contains the above modified polyamide resin and epoxy resin.

Although a heat-resistant resinous composition of the present invention is not particularly limited, it may have a storage elastic modulus of 30 MPa or more at 300° C. and a 1% weight decreasing temperature of 280° C. or more after being cured.

DESCRIPTION OF THE PREFERRED EMBODIMENTS

Generally, in an adhesive agent of a resinous composition obtained by mixing epoxy resin and polyamide resin, epoxy resin forms cross-links by epoxy resin curing agent, but polyamide resin is not involved in this cross-links at all. For this reason, heat-resistance of a resinous composition is determined by the kind and the proportion of epoxy resin contained in the composition. In order to increase a storage elastic modulus of the composition under a high temperature condition, it is necessary to increase the proportion of epoxy resin. However, such composition does not manifest flexibility after it is cured, so that its adhesive strength is decreased. When this composition is used for a laminate, a warping level of the laminate is increased.

In the present invention, one component of an adhesive composition is allowed to react with epoxy resin to form epoxy-terminated polyamide resin, and thus its compatibility with another component of the adhesive composition, i.e. epoxy resin, is increased. Then, epoxy-terminated polyamide resin is reacted with acid anhydride compound to introduce carboxy group into a resin skeleton. This carboxy group can be reacted with epoxy resin when the composition is prepared. Since carboxy group capable of reacting with epoxy resin is introduced into a skeleton of polyamide resin, polyamide resin is involved in cross-linking reaction when an adhesive agent is cured. Accordingly, the cross-linking density is increased throughout the composition and a storage elastic modulus is increased at a high temperature condition.

Thus, a heat-resistant resinous composition having the ability of low curing shrinkage and high heat-resistance can be obtained by mixing a modified polyamide resin and an epoxy resin. More concretely, a heat-resistant resinous composition having a storage elastic modulus of 30 MPa or more at 300° C. and a 1% weight decreasing temperature of 280° C. or more can be obtained.

Preferred embodiments of the present invention will be described in detail below.

In the present invention, epoxy-terminated polyamide, which is to be reacted with acid anhydride compound, can be synthesized by using a method disclosed in the published Japanese Patent Application No. 5-51447 or No. 5-51571. Concretely, epoxy-terminated polyamide is a reactant of carboxy-terminated polyamide and epoxy resin, and carboxy-terminated polyamide ("Carboxy-terminated polyamide" used herein means polyamide having carboxy groups at both termini of its molecule) can be obtained by a reaction of dicarboxylic acid compound with diamine compound or diisocyanate compound. Dicarboxylic acid compound used in the present invention is not particularly limited. For example, adipic acid, sebacic acid, dodecane dicarboxylic acid and dimer acid can be used alone or in combination of two or more. It is preferable to use dimer acid, because polyamide having a low hygroscopicity can be obtained by using dimer acid. Any dimer acid can be used, as far as it is derived from unsaturated fatty acid. Dimer acid may contain monomer acid, trimer acid or the like, or it may be hydrogenerated dimer acid whose double bond(s) is/are saturated. For example commercially available products can also be used as dimer acid.

A diamine compound or a diisocyanate compound to be reacted with dicarboxylic acid is not particularly limited. For example, hexamethylene diisocyanate, toluene diisocyanate, diphenylmethane diisocyanate, isophorone diisocyanate, and diamine compounds thereof can be used alone or in combination of two or more. If a diamine or diisocyanate compound having a following structure

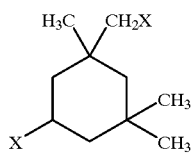

wherein X represents —NH$_2$ or —NCO, is used in the reaction, a resultant composition has excellent heat-resistance and hygroscopic resistance.

Carboxy-terminated polyamide can be obtained by a known method in which diamine compound is added to dicarboxylic acid. Alternatively, carboxy-terminated polyamide can be obtained by a reaction of dicarboxylic acid and diisocyanate compound, and more concretely, dicarboxylic acid and diisocyanate compound are reacted in an organic solvent such as N-methyl pyrrolidone (NMP) or dimethylformamide(DMF) with heating.

The weight-average molecular weight of carboxy-terminated polyamide preferably ranges from 300 to 10,000, and more preferably from 500 to 5,000. The average molecular weight is determined by titration of a carboxy group. For example, carboxy-terminated polyamide is weighed out and diluted with toluene/ethanol mixed solvent. Then this solution is titrated with a solution of N/10 potassium methoxide/benzene methanol to determine an acid equivalent weight. By doubling the value of the acid equivalent weight, the weight-average molecular weight is finally determined. When the average molecular weight is 300 or less, the resultant polyamide does not exhibit sufficient flexibility so that it does not have sufficient adhesiveness and the ability of low curing shrinkage. In other words, it is impossible to obtain polyamide having an adhesiveness sufficient to impart a 90.degree. peel strength of 0.6 kg/cm or more. Further, in the case of an adhesive tape having a 35 mm-wide organic insulated film and a 26 mm-wide adhesive layer, warping level (an average value of heights of the four corners of the 50 mm-long tape) as low as 2.0 mm or less cannot be manifested after the adhesive layer is cured. On the other hand, when the average molecular weight is 10,000 or more, resultant modified polyamide resin contains less amount of carboxy group and cross-linking density is decreased, so that a heat-resistant resinous composition having a storage elastic modulus of 30 MPa or more at 300° C. after being cured cannot be obtained.

The average molecular weight of carboxy-terminated polyamide is adjusted by adjusting a mole ratio of dicarboxylic acid compound to a diamine or diisocyanate compound, which is a starting material.

Epoxy resin, which is to be reacted with carboxy-terminated polyamide, may be bifunctional epoxy resins such as bisphenol A epoxy resin, bisphenol F epoxy resin, bisphenol AD epoxy resin, hydrogenerated bisphenol A epoxy resin, biphenol epoxy resin, ethyleneglycol epoxy resin, diglycidyl ester phthalate, diglycidyl ester tetrahydrophthalate, diglycidyl ester hexahydrophthalate, bifunctional naphthalene type epoxy resin, alicyclicepoxyacetal, alicyclicdiepoxycarboxylate, vinyl cyclohexene dioxide, diglycidyl hydantoin, bifunctional-silicon-contained epoxy resin and the like. Among them, aromatic glycidyl ether is preferably used in terms of heat-resistance, and bisphenol A epoxy resin is most preferably used in terms of low costs. These can be used alone or in combination of two or more. Further, as far as reaction is controllable, multifunctional epoxy resin having three or more functional groups can be added.

Epoxy-terminated polyamide can be obtained by adding epoxy resin in amounts substantially equimolar with carboxylic acid to carboxy-terminated polyamide and then reacting the mixture in the presence of heat.

Thus-obtained epoxy-terminated polyamide has the following structure

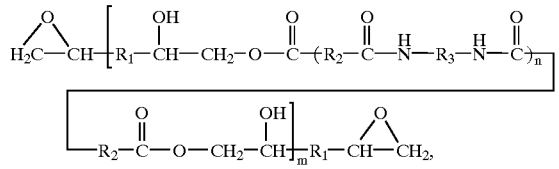

wherein $R_1$, $R_2$, and $R_3$ each are a bivalent organic group, and m and n each are a natural number.

Although there is no limit to acid anhydride which is to be reacted with epoxy-terminated polyamide resin to produce a modified polyamide resin, it is preferred to use an acid monoanhydride compound such as succinic acid anhydride, maleic acid anhydride, dodecenylsuccinic anhydride, tetrahydrophthalic anhydride, methyltetrahydrophthalic anhydride, hexahydrophthalic anhydride, methlhexahydrophthalic anhydride, nadic anhydride, methyl nadic anhydride, phthalate anhydride, tetrachlorophthalic anhydride, tetrabromophthalic anhydride, trimellitic acid anhydride and the like, and these acid monoanhydride compounds can be used alone or in combination of two or more. As far as reaction is controllable, a multi acid anhydride compound such as a diacid anhydride compound can be added.

A modified polyamide resin can be obtained by adding an acid anhydride compound in amounts substantially equimolecular with a hydroxyl group to epoxy-terminated polyamide and then reacting a mixture in the presence of heat. In this case, for example, an organic solvent such as methyl ethyl ketone(MEK), toluene, chlorobenzene, dimethylformamide(DMF), dimethylacetoamide (DMAc), and the like can be used as a reaction solvent, but a reaction solvent is not particularly limited.

The structural formula of thus-obtained epoxy-terminated polyamide can be varied depending on a kind of $R_n$, con tained in epoxy-terminated polyamide. For example, epoxy-terminated polyamide can be of the following structure

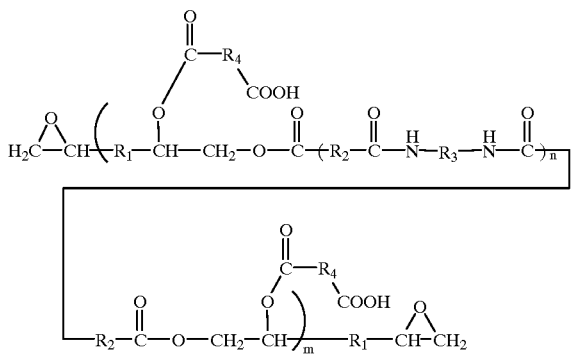

wherein $R_1$, $R_2$, $R_3$ and $R_4$ each are a bivalent organic group, and m and n each are a natural number. However, depending on the reaction condition, there may be a case where carboxylic acids are not substituted for all the hydroxyl groups of epoxy-terminated polyamide, and therefore, the structural formula of epoxy-terminated polyamide is not limited to the above. Alternatively, depending on the reaction condition, there may also be a case where more carboxy group can be contained in a modified polyamide resin. For example, where $R_1$ has highly reactive groups such as hydroxyl groups, more carboxy groups may be introduced to a modified polyamide resin by the reaction between acid anhydride and the groups contained in $R_1$ during the reaction of acid anhydride and epoxy-terminated polyamide. In order to obtain a sufficient cross-linking density after a resinous composition is produced by a mixture of epoxy resin, it is preferable that more carboxy groups are contained in a modified polyamide resin.

The amount of carboxy groups of this modified polyamide resin is determined by acidimetry. Specifically, the molecular weight of a carboxylic acid (carboxylic acid equivalent weight) is obtained by determining the amount of carboxylic acid contained in a molecular by acid-base titration. Preferably, carboxylic acid equivalent weight of the modified polyamide resin is 1500 or less, and more preferably 1000 or less. When carboxylic acid equivalent weight of the modified polyamide is more than 1500, sufficient cross-linking density cannot be obtained, so that a storage elastic modulus at 300° C. is decrease to less than 30 MPa. The amount of carboxy groups of this modified polyamide resin is determined by acidimetry, in which the sample having a solid concentration of 40% is diluted ten times with a toluene/ethanol mixture and then the solution of the sample is titrated with 0.1N KOH standard solution of benzene-methanol.

Epoxy resin, which is to be used for producing a heat-resistant resinous composition by the mixing of a modified polyamide resin, may be bisphenol A epoxy resin, bisphenol F epoxy resin, bisphenol AD epoxy resin, hydrogenerated bisphenol A epoxy resin, cresol novolac epoxy resin, phenol novolac epoxy resin, dicyclopentadien-phenol epoxy resin, tris(hydroxyl)phenylmethane epoxy resin, glycidyl ether epoxy resin, ethyleneglycol epoxy resin, diglycidyl phthalate, triglycidyl phthalate, diglycidyl tetrahydrophthalate, diglycidyl hexahydrophthalate, alicyclic diepoxy acetal, alicyclic diepoxy carboxylate vinyl cyclohexene dioxide, silicon-contained epoxy resin, glycidyl amine epoxy resin, naphthalene epoxy resin, triglycidyl isocyanate, diglycidyl hydantoin, and the like. It is preferable to use epoxy resin having epoxy equivalent weight of 300 or less in terms of heat-resistance. It is more preferable to use multifunctional epoxy resin having three or more functional groups and epoxy equivalent weight of 300 or less. These epoxy resins can be used alone or in combination of two or more.

The mixing weight ratio of a modified polyamide resin to epoxy resin is determined by the amount of carboxy groups contained in a modified polyamide resin and the amount of epoxy groups contained in epoxy resin. Preferably, the mole ratio of carboxy group and epoxy group ranges from 0.5 to 1.5, and more preferably, from 0.7 to 1.2. If this mixing ratio falls below 0.5, some unreacted epoxy resin left decreases a starting temperature of thermal decomposition, and the heat-resistant property cannot be manifested. If the ratio exceeds 1.5, the amount of unreacted carboxy groups is increased and sufficient cross-linking density cannot be obtained. As a result, a storage elastic modulus at 300° C. is decreased to less than 30 MPa. When the number of mole ratio of carboxy group and epoxy group ranges from 0.5 to 1.5, the mixing weight ratio of a modified polyamide resin to epoxy resin is preferably from 20/80 to 80/20, and more preferably, form 30/70 to 75/25. If this mixing weight ratio falls below the above range, or if the mixing amount of epoxy resin is more than that of a modified polyamide resin, sufficient adhesiveness and the ability of low curing shrinkage cannot be manifested. If this mixing weight ratio exceeds the above range, or if the mixing amount of a modified polyamide resin is more than that of epoxy resin, sufficient cross-linking density cannot be obtained, so that a storage elastic modulus at 300° C. is decreased to less than 30 MPa.

A heat-resistant resinous composition of the present invention can be obtained by mixing proper amounts of the above modified polyamide resin and epoxy resin, and it may be mixed with a known epoxy resin curing agent such as phenol resin, acid anhydride, amine, and the like. Preferably, phenol resin is added, and more preferably, a multifunctional phenol resin such as phenol novolac resin is added in terms of heat-resistance.

The heat-resistant resinous composition to be obtained is cured for several hours at the temperature of 60 to 200° C. In order to prevent the decomposition of low molecular weight compounds of the resinous composition due to thermal curing, it is preferred that the heating temperature is raised gradually from a low to a high temperature. Further, for sufficient curing, thermal curing is preferably carried out at 150° C. or more for several hours.

The resinous composition may contain other kinds of components or an amount of components which do not provoke a severe drop in coefficient of elasticity. For example, the resinous composition may be considered to contain such a resinous component as acrylic resin, phenol resin, imide resin, rubber resin, and the like; hardening accelerator or hardening catalyst for epoxy resin; various inorganic or organic fillers; and the like. In terms of operability, it is preferable to dissolve these components in various organic solvents for use.

Uses for a resinous composition of the present invention are not particularly limited, however, the resinous composition is suitably used to form an adhesive layer of an adhesive tape for a semiconductor device. An adhesive tape for a semiconductor device according to the present invention is of a three-layered structure in which a semi-cured adhesive layer (which is in a B-stage) and a protective film as a protective layer are successively laminated on a surface of organic insulated film.

Although an adhesive layer of an adhesive tape for a semiconductor device according to the present invention may be spread throughout one surface of an organic insulated film, it is preferably spread over a part of the one surface of an organic insulated film. More preferably, the adhesive tape for a semiconductor device has no adhesive part on both ends of a surface of an organic insulated film. For example, it is preferable to use an adhesive tape for a semiconductor device having an adhesive layer with a 26 mm-wide protective tape in the center of 35 mm-wide organic insulated film, an adhesive tape for a semiconductor device having an adhesive layer with a 61 mm-wide protective tape in the center of 70 mm-wide organic insulated film, and the like, which have no adhesive part on both ends of a surface to provide sprocket holes for conveyance. However, an adhesive tape of the present invention is not limited to the above.

Although an organic insulated film used for an adhesive tape for a semiconductor device is not particularly limited, the film may consist of heat-resistant film such as polyimide, polyether imide, polyether sulfide, polyether etherketone, and the like, and composite heat-resistant film such as epoxy resin-glass fabric, epoxy resin-polyimide-glass fabric, and the like, each of which has a thickness of 25 to 175 $\mu$m, preferably 50 to 125 $\mu$m. Among them, polyimide film is the most preferably used.

An adhesive layer of the present invention is a thermally semi-cured type (which is in a B-stage). The adhesive layer has a film thickness of 5 to 30 $\mu$m, and more preferably 5 to 20 $\mu$m. If the film thickness of the adhesive layer falls below the above range, the adhesive layer cannot have enough adhesive strength. When adhesive strength is evaluated in accordance with JIS-C5016, the adhesive tape for a semiconductor device of the present invention has a 90.degree. peel strength of 0.6 kg/cm or more, and preferably 0.8 kg/cm or more. If the film thickness of the adhesive layer exceeds the above range, the warping level of the adhesive layer is increased, which cause inconvenience in the process of conveyance. For example, in the case of an adhesive tape having a 35 mm-wide organic insulated tape and a 26 mm-wide adhesive layer, warping level (an average value of heights of the four corners of the 50 mm-long tape) is increased to more than 2.0 mm after the adhesive layer is cured. The warping level (an average value of heights of the four corners of the 50 mm-long tape) of a tape for a semiconductor device according to the present invention, which, for example, has a 35 mm-wide organic insulated tape and a 26 mm-wide adhesive layer, is adjusted to 2.0 mm or less, and preferably to 1.5 mm or less.

A protective film, which is a layer for protecting an adhesive layer of an adhesive tape for a semiconductor device according to the present invention, is not limited, however, polyester film such as polyethylene terephthalate and the like can be most preferably used.

A preferable example of a method for producing an adhesive tape for a semiconductor device according to the present invention will be described below, however, the producing method is not particularly limited. As far as an adhesive layer and a protective layer can be laminated on one surface of an insulated film, any method can be adopted.

First, an adhesive agent consisting of a heat-resistant resinous composition of the present invention is so applied to a protective tape that a predetermined film thickness can be obtained after it is dried. Then, it is dried at 120° C. to 150° C. for one to three minutes to semi-cure the adhesive layer (to bring it to a B-stage). An organic insulated film is laminated on an adhesive-layer side of a laminate consisting of thus-obtained protective layer and adhesive layer, and is heat-pressed at 20 to 150° C. with 1 kg/cm$^2$ of pressure. Thus, the tape for a semiconductor device according to the present invention can be produced.

EXAMPLE

Next, Examples of the present invention will be described, however, the present invention is not limited to the following Examples. Many changes, modifications, and variations can be made to the embodiments on the basis of knowledge of those skilled in the art without departing from the spirit and scope of the invention.

In the following Examples, the term "parts" represents "parts by weight", and the mark "%" represents "weight %".

Comparative Example 1

A: Synthesis of Carboxy-terminated Polyamide 50 g of dimer acid (containing 1% trimer acid) (PRIPOL-1009; Unichema Chemie B.U.) and 87 g of NMP were placed in a flask equipped with a stirrer and a reflux condenser, and dissolved with stirring. Then 13 g of isophorone diisocyanate was added and heated at 100° C. for an hour, at 150° C. for 3 hours, and at 200° C. for 2 hours to proceed with a reaction. This reaction solution was freed of NMP and thus carboxy-terminated polyamide was synthesized.

B: Synthesis of Epoxy-terminated Polyamide 30 g of the carboxy-terminated polyamide (molecular weight: 1950) obtained in the above A, 16 g of epoxy resin "Epikote 1001" (Yuka Shell Epoxy Kabushiki Kaisha), 120 g of chlorobenzene, and 0.5 ml of triethylamine were weighed out and placed in a flask equipped with a stirrer and a reflux condenser, and then refluxed at 150° C. for 6 hours to proceed with a reaction. This reaction solution was freed of chlorobenzene and triethylamine, and thus epoxy-terminated polyamide was synthesized.

C: Preparation of Resinous Composition 60 parts of epoxy-terminated polyamide obtained in the above B, 25 parts of cresol novolac-type epoxy resin "Epikote 180S65 (Yuka Shell Epoxy Kabushiki Kaisha)", and 15 parts of phenol novolac-type resin "TD2131 (Dainippon Ink and Chemicals INC.)" were mixed and dissolved in 80 parts of toluene and 80 parts of MEK. Thus a resinous composition was prepared.

Comparative Example 2

Preparation of Resinous Composition 30 parts of epoxy-terminated polyamide obtained in the B of above Comparative Example 1B, 45 parts of cresol novolac-type epoxy resin "Epikote 180S65 (Yuka Shell Epoxy Kabushiki Kaisha)", and 25 parts of phenol novolac-type resin "TD- 2131 (Dainippon Ink and Chemicals INC.)" were mixed and dissolved in 80 parts of toluene and 80 parts of MEK. Thus a resinous composition was prepared.

Comparative Example 3

Preparation of Resinous Composition 30 parts of epoxy-terminated polyamide obtained in the above Comparative Example 1B, 45 parts of cresol novolac-type epoxy resin "Epikote 180S65 (Yuka Shell Epoxy Kabushiki Kaisha)", and 25 parts of resol resin "PS-2780 (Gun Ei Chemical Industry Co.,Ltd.)" were mixed and dissolved in 80 parts of toluene and 80 parts of MEK. Thus a resinous composition was prepared.

Example 1

A: Synthesis of Modified Polyamide Resin 30 g of epoxy-terminated polyamide obtained in the above Comparative Example 1B, 5 g of trimellitic acid anhydride, 75 g of DMAc were weighed out, and heated at 80° C. for 2 hours to proceed with a reaction. This reaction solution was purified by the use of 600 g of ethanol and then it was freed of ethanol. Thus a modified polyamide resin was yielded.

B: Preparation of Resinous Composition 65 parts of the above-obtained modified polyamide, and 35 parts of cresol novolac-type epoxy resin "Epikote 180S65 (Yuka Shell Epoxy Kabushiki Kaisha)" were mixed and dissolved in 80 parts of toluene and 80 parts of MEK. Thus a resinous composition was prepared.

Example 2

A: Synthesis of Carboxy-terminated Polyamide 50 g of dimer acid (containing 1% trimer acid) (PRIPOL-1009; Unichema Chemie B.V.), 13 g of adipic acid, and 100 g of NMP were placed in a flask equipped with a reflux condenser and a stirrer and dissolved with stirring. Then 20 g of isophorone diisocyanate was added and heated at 100° C. for an hour, at 150° C. for 3 hours, and at 200° C. for 2 hours to proceed with a reaction. This reaction solution was freed of NMP and thus carboxy-terminated polyamide was synthesized.

B: Synthesis of Epoxy-terminated Polyamide 30 g of the carboxy-terminated polyamide (molecular weight: 840), which was obtained in the above A, 36 g of epoxy resin "Epikote 1001" (Yuka Shell Epoxy Kabushiki Kaisha), 120 g of chlorobenzene, and 0.5 ml of triethylamine were placed in a flask equipped with a stirrer and a reflux condenser, and refluxed at 150° C. for 6 hours to proceed with a reaction. This reaction solution was freed of chlorobenzene and triethylamine, and thus epoxy-terminated polyamide was synthesized.

C: Modified Polyamide Resin 30 g of epoxy-terminated polyamide obtained in the above B, 7 g of succinic anhydride, and 75 g of chlorobenzene were weighed out, and heated at 80° C. for 2 hours to proceed with a reaction. This reaction solution was purified by the use of 600 g of ethanol and then it was freed of ethanol. Thus a modified polyamide resin was yielded.

D: Resinous Composition 50 parts of epoxy-terminated polyamide obtained in the above C, 40 parts of cresol novolac-type epoxy resin "Epikote 180S65 (Yuka Shell Epoxy Kabushiki Kaisha)", and 10 parts of phenol novolac-type resin "TD2131 (Dainippon Ink and Chemicals. INC.)" were mixed and dissolved in 80 parts by weight of toluene and 80 parts by weight of MEK. Thus resinous solution was prepared.

(Acidimetry)

The modified polyamides of the present invention, which were obtained in the above Examples, were titrated to determine the amount of acid as follows: First, modified polyamide solution having a solids concentration of 40% was weighed out and diluted with a mixed solvent of toluene/ethanol. Then the solution was titrated with N/10 potassium methoxide/benzene-methanol solution to determine an acid equivalent weight. The modified polyamide of Example 1 had an acid equivalent weight of 850, and the modified polyamide of Example 2 had an acid equivalent weight of 550.

(Evaluation Test for Properties)

1) Measurement of Storage Elastic Modulus

Test samples for measurement of storage elastic modulus were prepared by heating resinous compositions yielded in Examples and Comparative Examples gradually from a low temperature to a high temperature and heating it at 160° C. for four hours. A storage elastic modulus of each test sample was measured by using a DMS200 Dynamic Mechanical Spectrometer (Seiko Instruments Inc.), in a tensile mode, at a frequency of 1 Hz, at a programming rate of 5° C./min. in air, and at the temperature of 300° C. in air. Results of the measurements are shown in Table 1.

2) Measurement of Thermal Decomposition

Test samples for measurement of thermal decomposition were prepared in the same manner as the test samples for measurement of storage elastic modulus. A thermal decomposition of each test sample was evaluated by 1% weight reduction temperature of each test sample. The 1% weight reduction temperature is a temperature measured under a condition of a programming rate of 20° C./min in air using TG/DTA220 Thermogravimetric Differential Thermal Analyzer (Seiko Instruments Inc.). Results of the measurement are shown in Table 1.

3) Measurement of Adhesive Strength

Resinous compositions obtained in Examples and Comparative Examples each were applied as an adhesive layer to a 75 µm-thick polyimide film (Upilex S, Ube Industries, Ltd.), and dried at 130° C. for 2 minutes to form a 15 µm-thick adhesive layer evenly on the polyimide film. 25 µm-thick copper foil (3EC-VLP, Mitsui Mining CO.LTD.) was laminated on the adhesive layers at 120° C. and then the adhesive layers were thermally cured. In accordance with JIS-C5016, peel strength of each adhesive layer was measured.

4) Measurement of Warping Level

Adhesive layers in a B-stage having a thickness of 15 µm and a width of 26 mm were formed as an adhesive layer on polyimide films (Upilex S, Ube Industries, Ltd.) having a thickness of 75 µm and a width of 35 mm. 25 µm-thick copper foil (3EC-VLP, Mitsui Mining CO.LTD.) was laminated on the adhesive layers at 120° C. and then the adhesive layers were thermally cured to produce copper-clad laminate boards. These copper-clad laminate boards were cut to a 50 mm-length each and they were etched to remove copper foil, and then washed and dried. After being left for 50 hours at the temperature of 20° C. and the humidity of 60%, heights of four corners of each 50 mm-long tape were measured, and the average of the heights were defined as a warping level.

Properties of test samples prepared by using resinous compositions yielded in Examples and Comparative Examples are shown in Table 1.

TABLE 1

|  | Storage elastic modulus at 300° C. (MPa) | Thermal decomposition 1% weight reduction temperature (° C.) | Adhesive strength (kg/cm) | Warping level (mm) |
|---|---|---|---|---|
| EXAMPLE 1 | 45 | 315 | 1.3 | 0.3 |
| EXAMPLE 2 | 85 | 305 | 1.0 | 1.0 |
| COMPARATIVE EXAMPLE 1 | 0.001 | 300 | 1.5 | 0.1 |
| COMPARATIVE EXAMPLE 2 | 35 | 310 | 0.3 | 1.5 |
| COMPARATIVE EXAMPLE 3 | 40 | 240 | 0.8 | 3.0 |

INDUSTRIAL APPLICATION

A modified polyamide resin obtained according to the present invention can be mixed with epoxy resin to prepare a heat-resistant resinous composition. This heat-resistant resinous composition has excellent heat-resistance, high adhesive strength and the ability of low curing shrinkage, and can be used for an adhesive agent suitable for flexible printed wiring board and an adhesive member for mounting a semiconductor device.

An adhesive tape prepared by using this heat-resistant resinous composition has particularly excellent properties so that no poor bonding is caused by softening of an adhesive agent due to the application of heat when it is mounted by wire-bonding method. Furthermore, as 1% weight reduction temperature of a cured adhesive layer is 280° C. or more, no work tool is polluted with gas generated under a high temperature condition caused by solder reflow. The advantage of the adhesive tape for a semiconductor device according to the present invention is that no misalignment is caused by differences in size in a mounting step or no conveyance failure occurs in the process of conveyance.

What is claimed is:

1. A modified polyamide resin obtained from the reaction of an acid anhydride compound with an epoxy-terminated polyamide, said epoxy-terminated polyamide having the structure:

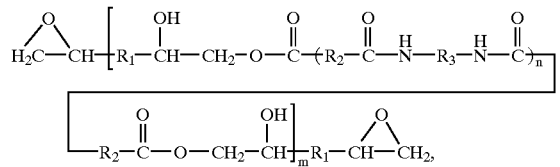

wherein R1, R2, and R3 each are a bivalent organic group, and m and n each are a natural number.

2. A heat-resistant resinous composition comprising:
the modified polyamide resin as claimed in claim 1 and an epoxy resin.

3. The heat-resistant resinous composition as claimed in claim 2, having a storage elastic modulus of 30 MPa or more at 300° C. and a 1% weight reduction temperature of 280° C. or more after being cured.

4. An adhesive tape for a semiconductor device having a heat-resistant adhesive layer and a protective layer laminated on one surface of an organic insulated film, wherein the heat-resistant adhesive layer comprises the heat-resistant resinous as claimed in claim 2.

5. An adhesive tape for a semiconductor device, having a heat-resistant adhesive layer and a protective layer laminated on one surface of an organic insulated film, wherein the heat-resistant adhesive layer comprises the heat-resistant resinous composition as claimed in claim 3.

* * * * *